United States Patent [19]
Yaguchi et al.

[11] Patent Number: 5,299,092
[45] Date of Patent: Mar. 29, 1994

[54] PLASTIC SEALED TYPE SEMICONDUCTOR APPARATUS

[75] Inventors: Akihiro Yaguchi, Ibaraki; Asao Nishimura, Ushiku; Makoto Kitano, Tsuchiura; Ichiro Anjoh, Koganei; Junichi Arita, Musashino, all of Japan

[73] Assignee: Hitachi, Ltd., Tokyo, Japan

[21] Appl. No.: 886,859

[22] Filed: May 22, 1992

[30] Foreign Application Priority Data

May 23, 1991 [JP] Japan ................................. 3-118351

[51] Int. Cl.<sup>5</sup> ...................... H05K 7/00; H01L 23/28
[52] U.S. Cl. .................................. 361/728; 174/52.2; 257/686; 361/730
[58] Field of Search ..................... 174/52.2, 52.3, 52.4; 361/728, 729, 730, 736, 752, 772, 796; 29/841, 848, 855, 856; 437/220, 219; 257/685, 686, 666, 787

[56] References Cited

FOREIGN PATENT DOCUMENTS 5165661 12/1980 Japan .................................. 257/686
3261739 10/1988 Japan .................................. 257/686
2-97050 4/1990 Japan .................................. 257/686

*Primary Examiner*—Leo P. Picard
*Assistant Examiner*—Bot Ledynh
*Attorney, Agent, or Firm*—Antonelli, Terry, Stout & Kraus

[57] ABSTRACT

A plastic sealed type semiconductor apparatus includes at least two semiconductor devices which are disposed with a space therebetween in such a manner that circuit forming surfaces oppose each other, and an electric signal lead which is adhered to each of the circuit forming surfaces with an insulating member provided therebetween for electric insulation and which is electrically connected to the semiconductor device by a thin metal wire. The semiconductor devices and the electric signal leads are sealed with a resin in a state where the electric signal leads are laid on top of one another to form a plastic package. The overlaid portion of the electric signal leads has a surface contact portion of the leads and a resin providing portion. The resin providing portion is a recessed portion which is formed when the resin is molded in such a manner that it passes through the surface contact portion of the leads in the lateral direction thereof. The resin providing portion prevents entry of water or moisture and thus eliminates corrosion or breakage of the electric interconnections formed on the circuit forming surface of the semiconductor device or thin metal wires. Thus, the reliability of the semiconductor apparatus is improved.

15 Claims, 8 Drawing Sheets

PLASTIC SEALED TYPE SEMICONDUCTOR APPARATUS

BACKGROUND OF THE INVENTION

1. Field of the Invention

The present invention relates to a plastic sealed type semiconductor apparatus, and more particularly, to a plastic sealed type semiconductor apparatus which is highly reliable and hence suited for high integration.

2. Description of the Prior Art

Conventional plastic sealed semiconductor apparatus has the structure in which a semiconductor device is fixed on a chip pad which is the device mounting portion with a plurality of leads disposed around the chip pad, in which the semiconductor device and the leads are electrically connected by thin metal wires and in which a resin is molded around the entire assembly.

In recent years, there has been an increasing demand for semiconductor apparatuses in which a plurality of semiconductor devices are mounted on the chip pad to achieve a high degree of integration. Japanese Patent Unexamined Publication Nos. 62-119952, 1-257361 and 60-47161 disclose a structure in which a plurality of semiconductor devices are fixed onto chip pads in the conventional manner.

While the structure in which a plurality of semiconductor devices are mounted has been studied to achieve a high degree of integration, the size of a single semiconductor device has been increased also to achieve a high degree of integration. However, there is a tendency that the external dimensions, particularly, the external dimensions in the direction of the plane, of the semiconductor apparatus cannot be increased or is reduced due to design restrictions of the substrate on which the semiconductor apparatus is mounted.

Under the circumstances, in the structures in which the semiconductor devices are fixed on the chip pads in the conventional manner, when the size of each of the semiconductor devices is increased but the external dimensions of the semiconductor apparatus remains the same, the length of that portion of the semiconductor apparatus which fixes the leads to the resin (the length of the inner lead which is buried in the resin) is reduced. Thus, there is raised a problem that fixing strength is not sufficiently provided to the lead.

To avoid this problem, Japanese Patent Unexamined Publication No. 61-241959 has proposed a structure in which a plurality of inner leads are adhered to the circuit forming surface of a semiconductor device with an insulating member therebetween. This structure is called a lead-on-chip configuration.

FIG. 17 illustrates an example of a plastic sealed type semiconductor apparatus in which two semiconductor devices having the lead-on-chip structure are laid on top of one another, which apparatus is the subject of this invention.

As shown in FIG. 17, electric signal leads 2 and 2' are adhered to circuit forming surfaces 1a and 1'a of semiconductor devices 1 and 1' with an insulating member 3 provided therebetween for electric insulation between the semiconductor devices 1 and 1' and the leads 2 and 2'. Electric connection between the semiconductor devices 1 and 1' and the electric signal leads 2 and 2' is provided by means of thin metal wires 4.

The two semiconductor devices having the lead-on-chip structure are disposed in such a manner that the circuit forming surfaces thereof oppose each other. The electric signal leads 2 and 2' are joined to each other at an overlaid portion 2a thereof. A resin 5 is molded around the semiconductor devices and the electric signal leads to form a resin package 6. Whereas the electric signal lead 2' is cut substantially at the same level as the side surface of the resin package 6, only the electric signal lead 2 is coupled to an outer lead 7.

Thus, plastic sealed semiconductor apparatus is provided by overlaying the lead-on-chip type semiconductor devices on top of each other, so that the outer dimensions of the semiconductor apparatus do not increase even when the semiconductor devices employed are large, and sufficient fixing strength of the leads is provided.

However, in the plastic sealed semiconductor apparatus in which the lead-on-chip type semiconductor devices are overlaid on top of each other, as shown in FIG. 17, since the joined portions of the electric signal leads 2 and 2' are restricted in only a little area, there is space on a major portion of the overlaid surfaces of the electric signal leads 2 and 2' so that water or moisture readily enter the interior of the plastic package 6 through the overlaid surfaces of the electric signal leads 2 and 2'.

When the water or moisture enters the interior of the plastic package 6, this can corrode or break the electric interconnections or thin metal wires 4 formed on the circuit forming surfaces 1a and 1'a of the semiconductor devices 1 and 1', substantially reducing the reliability of the plastic sealed type semiconductor apparatus. Thus, entry of water or moisture into the interior of the plastic molded type semiconductor apparatus must be prevented.

SUMMARY OF THE INVENTION

It is an object of the present invention to provide a highly reliable plastic molded type semiconductor apparatus whose external dimensions do not increase even when a plurality of high integration semiconductor devices are mounted therein, which assures a sufficient lead fixing strength, and which can avoid entry of water or moisture.

The aforementioned object is achieved by the provision of a resin providing portion in the overlaid portion of electric signal leads provided to overlay at least two semiconductor devices having the lead-on-chip structure on top of each other.

In the first concept of the present invention, at least two semiconductor devices are disposed with a space therebetween such that circuit forming surfaces thereof oppose each other. An electric signal lead is electrically connected to each of the circuit forming surfaces. The electric signal leads are overlaid on top of one another. A plastic package is formed by sealing with a resin the semiconductor devices and the electric signal leads. The overlaid portion of the electric signal leads has a surface contact portion of the leads and a resin providing portion. The resin providing portion is a recessed portion which is formed in such a manner that it passes through the leads in the lateral direction thereof.

In the second concept of the present invention, at least two semiconductor devices are disposed with a space therebetween such that circuit forming surfaces thereof oppose each other. An electric signal lead is electrically connected to each of the circuit forming surfaces. The electric signal leads are overlaid on top of one another. A plastic package is formed by sealing with a resin the semiconductor devices and the electric signal leads. The overlaid portion of the electric signal leads has a surface contact portion of the leads and a resin providing portion. The leads are joined to each other at part of the surface contact portion thereof. The resin providing portion is formed between the joined portion and a lead extending point where the lead is extended to the outside of the plastic package in such a manner that it passes through the leads in the lateral direction thereof.

In the third concept of the present invention, at least two semiconductor devices are disposed with a space therebetween such that the circuit forming surfaces thereof oppose each other. An electric signal lead is electrically connected to each of the circuit forming surfaces. The electric signal leads are overlaid on top of one another. A plastic package is formed by sealing with a resin the semiconductor devices and the electric signal leads. The overlaid portion of the electric signal leads has a surface contact portion of the leads and a resin providing portion. The leads are joined to each other at part of the surface contact portion thereof. The resin providing portion is formed between the joined portion and a lead extending portion from which the lead is extended to the outside of the plastic package in such a manner that it passes through the leads in the lateral direction thereof and that it is exposed to the outside of the plastic package.

In the fourth concept of the present invention, at least two semiconductor devices are disposed with a space therebetween such that the circuit forming surfaces thereof oppose each other. An electric signal lead is electrically connected to each of the circuit forming surfaces. The electric signal leads are overlaid on top of one another. A plastic package is formed by sealing with a resin the semiconductor devices and the electric signal leads. The overlaid portion of the electric signal leads has a surface contact portion of the leads and a resin providing portion. The leads are joined to each other at part of the surface contact portion thereof. The resin providing portion is formed on an inner side of the joined portion in such a manner that it passes through the leads in the lateral direction thereof.

In the fifth concept of the present invention, at least two semiconductor devices are disposed with a space therebetween such that the circuit forming surfaces thereof oppose each other. An electric signal lead is electrically connected to each of the circuit forming surfaces. The electric signal leads are overlaid on top of one another. A plastic package is formed by sealing with a resin the semiconductor devices and the electric signal leads. The overlaid portion of the electric signal leads has a surface contact portion of the leads and a resin providing portion. The leads are joined to each other at part of the surface contact portion thereof outside of the plastic package. The resin providing portion is formed on an inner side of the joined portion in such a that it posses through the leads in the lateral direction thereof.

In the sixth concept of the present invention, at least two semiconductor devices are disposed with a space therebetween such that the circuit forming surfaces thereof oppose each other. An electric signal lead is electrically connected to each of the circuit forming surfaces. The electric signal leads are overlaid on top of one another. A plastic package is formed by sealing with a resin the semiconductor devices and the electric signal leads. Portions of the overlaid surfaces of the electric signal leads which are located outside of the plastic package are joined to each other, and a resin providing portion is formed by forming a space in each of the portions of the overlaid surfaces which are located within the plastic package.

In the seventh concept of the present invention, a plastic sealed type semiconductor apparatus includes at least two semiconductor devices, each of which has an insulating member adhered to a circuit forming surface thereof, an electric signal lead disposed on the insulating member, and a thin metal wire for providing an electrical connection between the electric signal lead and the semiconductor device. The electric signal leads are overlaid on top of one another such that circuit forming surfaces of the two semiconductor devices oppose each other. A plastic package is formed by sealing with a resin the semiconductor devices, the electric signal leads, the insulating member and the thin metal wire. A resin providing portion is provided in an overlaid portion of the electric signal leads.

In the eighth concept of the present invention, a plastic sealed type semiconductor apparatus includes at least two semiconductor devices each of which has an electric signal lead which is disposed on a circuit non-forming surface thereof with an insulating member therebetween. The electric signal lead and the semiconductor device are electrically connected with each other. The electric signal leads are overlaid on top of one another such that the circuit non-forming surfaces of the two semiconductor devices oppose each other. The electric signal leads are joined to each other. A plastic package is formed by sealing with a resin the semiconductor devices, the electric signal leads and the insulating member. A resin providing portion is formed in the electric signal leads in such a manner that it passes through the leads in the lateral direction thereof.

In the ninth concept of the present invention, a plastic sealed type semiconductor apparatus is provided as a plastic package is formed by sealing with a resin a semiconductor device and a plurality of electric signal leads which are electrically connected to the semiconductor device. The electric signal leads are overlaid on top of one another in such a manner that at least two semiconductor devices can be overlaid on top of one another. A resin providing portion is provided within the overlaid portion of the electric signal leads.

In a preferred form of the present invention, a notch or a thin-wall portion is formed in each of the opposing surfaces of the electric signal leads over the entire lateral length thereof to provide the resin providing portion.

In another preferred form of the present invention, one of the electric signal leads which are joined to each other is cut at the outside of the joined portion. More preferably, one of the electric signal leads which are joined to each other is cut outside the plastic package.

Preferably, at least one of the electric signal leads is used as a heat radiating lead.

The present invention can achieve to employ a 4 M bit, 16 M bit, 32 M bit or 64 M bit dynamic random access memory as a semiconductor device.

When the resin providing portion is provided in the overlaid portion of the electric signal leads, further entry of water or moisture which enters the interior of the semiconductor apparatus from the outside of the plastic package through the overlaid surfaces of the electric signal leads can be prevented.

Thus, corrosion or breakage of the electric interconnections formed on the circuit forming surface of the semiconductor device or the metal wires can be avoided.

DESCRIPTION OF THE PREFERRED EMBODIMENTS

Figure 1:
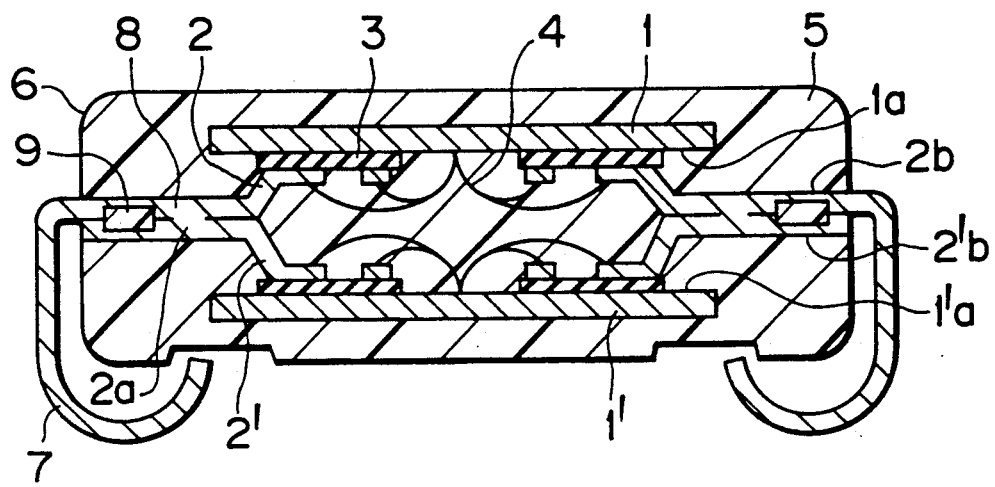
FIG. 1 is a cross-sectional view of a plastic sealed type semiconductor apparatus showing a first embodiment of the present invention.
Figure 2:
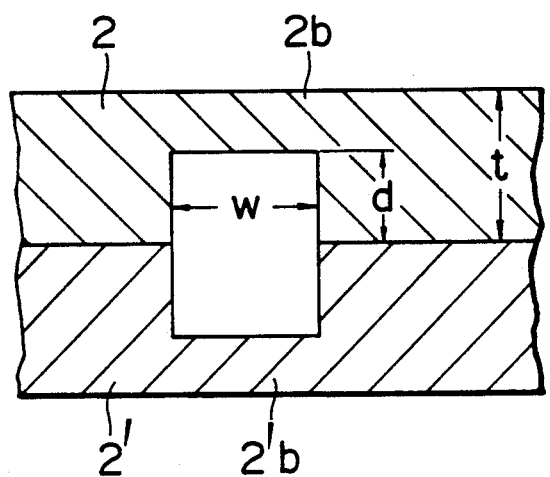
FIG. 2 is a partial cross-sectional view for illustrating the dimensional relation of a thin wall portion of an electric signal lead.

An embodiment of the present invention will be described below with reference to FIG. 1. FIG. 1 is a cross-sectional view of an embodiment of a plastic sealed type semiconductor apparatus according to the present invention.

In the structure shown in FIG. 1, one end of an electric signal lead 2 integrally forms an outer lead 7. One end of an electric signal lead 2' is cut at the level flush with the side surface of a plastic package 6.

The electric signal leads 2 and 2' are adhered to circuit forming surfaces 1a and 1a of semiconductor devices 1 and 1' with insulating members 3 provided therebetween for electric insulation between the semiconductor devices 1 and 1' and the electric signal leads 2 and 2', respectively. The semiconductor devices 1 and 1' and the electric signal leads 2 and 2' are electrically connected to each other by thin metal wires 4.

The two semiconductor devices 1 and 1' are disposed in such a manner that the circuit forming surfaces 1a and 1a oppose one another. The electric signal leads 2 and 2' are joined to each other at a joining portion 8 in an overlaid portion 2a of the electric signal leads 2 and 2'.

The overlaid portion 2a of the electric signal leads 2 and 2' has the thin wall portions 2b and 2'b to allow a resin 5 to be provided between the electric signal leads 2 and 2'. When the semiconductor devices are sealed with the resin 5, a resin providing portion 9 is formed between the thin wall portions 2b and 2'b.

In this embodiment, a semiconductor apparatus is formed by sealing with the resin 5 the semiconductor devices 1 and 1', the electric signal leads 2 and 2', the insulating members 3 and the thin metal wires 4.

In this embodiment, since the resin providing portion 9 is provided in the overlaid portion 2a of the electric signal leads 2 and 2', entry of water or moisture into the semiconductor apparatus can be avoided.

Consequently, corrosion or breakage of the electric interconnections on the circuit forming surfaces 1a and 1'a of the semiconductor devices 1 and 1' or thin metal wires 4 is prevented, and a highly reliable plastic sealed semiconductor apparatus capable of preventing entry of water can thus be provided.

The manufacturing method of the plastic sealed type semiconductor apparatus of this embodiment will be described below.

The electric signal leads 2 and 2' are adhered to the circuit forming surfaces 1a and 1'a of the semiconductor devices 1 and 1' with the insulating members 3 provided therebetween for electric insulation between the semiconductor devices 1 and 1' and the electric signal leads 2 and 2', and then the semiconductor devices 1 and 1' are electrically connected to the electric signal leads 2 and 2' by the thin metal wires 4.

Next, the electric signal leads 2 and 2' are overlaid on top of one another so that the two semiconductor devices 1 and 1' are disposed with the circuit forming surfaces 1a and 1'a facing each other, and the electric signal leads 2 and 2' are joined to one another by soldering or welding at the joining portion 8 in the overlaid portion 2a thereof.

Thereafter, the resin 5 is molded around the semiconductor devices, the electric signal leads, the insulating members and the thin metal wires, and then the electric signal lead 2' is cut at the level flush with the side surface of the plastic package 6. One end of the electric signal lead 2 is formed to be the outer lead 7 located outside the plastic package 6.

The insulating member 3 is made of a material which is mainly composed of at least one resin selected from epoxy resin, phenol resin and polyimide resin. When necessary, an inorganic filler or various types of additives can be added to the material.

The electric signal leads 2 and 2' and the outer lead 7 are formed of, for example, Fe-Ni alloy (Fe-42Ni) or Cu alloy.

The thin metal wires 4 are thin wires of aluminum (Al), gold (Au) or copper (Cu). Electric connection means other than the thin metal wire can also be employed in the present invention.

An epoxy resin to which a phenol type hardening agent, silicone rubber and a filler are added can be employed as the resin 5. A flame retarder, a coupling agent or a coloring agent can also be added to the resin 5. A filler may be silicon oxide grains.

The thin wall portions 2b and 2'b of the electric signal leads 2 and 2' are formed by etching or machined by a press. Depth d and width w of the thin wall portions 2b and 2'b are between 50 and 80% of a thickness t of the electric signal lead 2 or 2'.

The outer leads 7 are extended to the outside of the plastic package 6 in two directions in the case shown in FIG. 1. However, the direction is not limited to two directions but it may be one or at least three directions.

Furthermore, the outer lead 7 is of the J-bend type in which the distal end of a downwardly bent outer lead 7 is bent such that it is located below the undersurface of the plastic package 6. However, the outer lead 7 may be bent in any direction in any form. Alternatively, it may not be bent.

Figure 3:
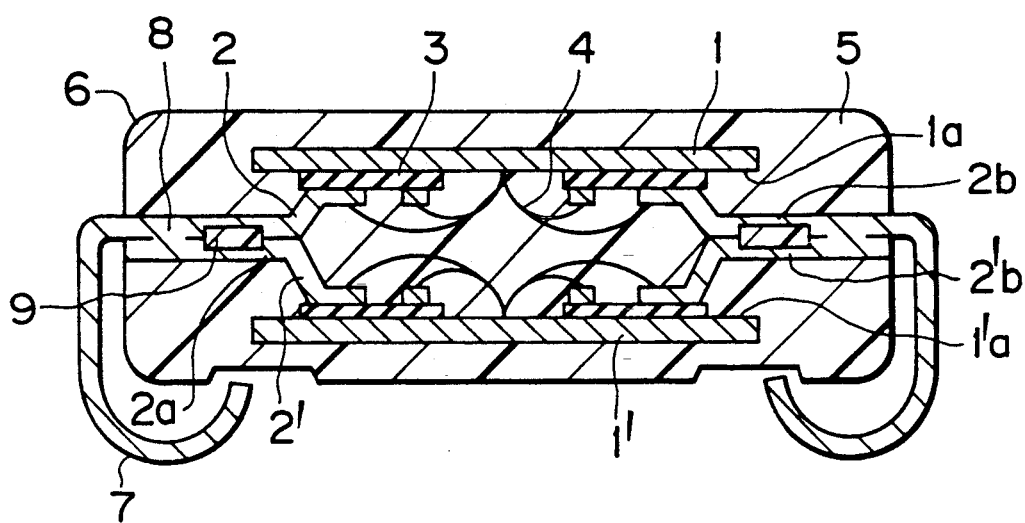
FIGS. 3 through 8 are respectively cross-sectional views of the plastic sealed type semiconductor apparatus showing various modifications of the first embodiment shown in FIG. 1.

In the embodiment shown in FIG. 1, the resin providing portion 9 is provided between the joined portion 8 of the electric signal leads 2 and 2' to one another and the side surface of the plastic package 6. However, it may be formed on the inner side of the joined portion 8, as shown in FIG. 3.

Figure 4:
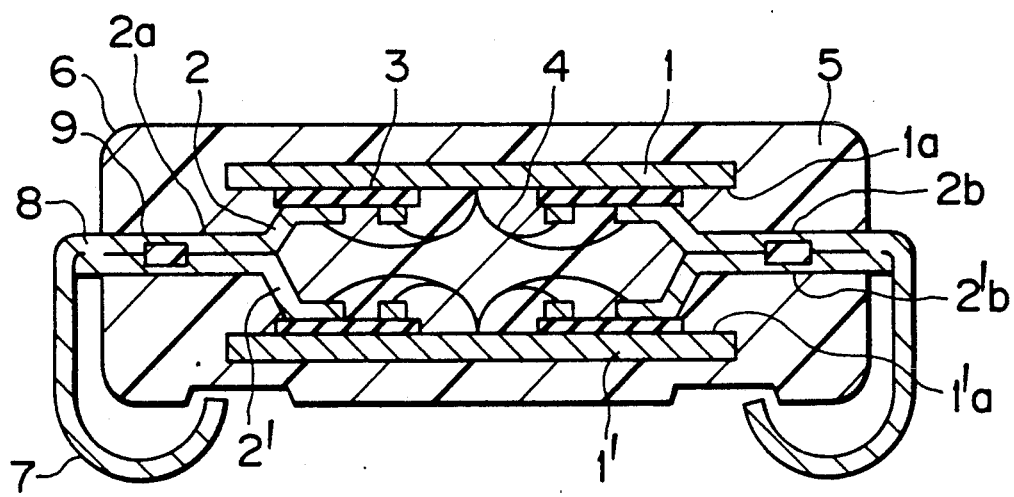

In the embodiment shown in FIG. 1, the joined portion 8 between the electric signal leads 2 and 2' is provided inside the plastic package 6. However, it may be provided outside the plastic package 6, as shown in FIG. 4.

In that case, the electric signal leads 2 and 2' may be joined to each other before or after the resin 5 is molded.

Figure 5:
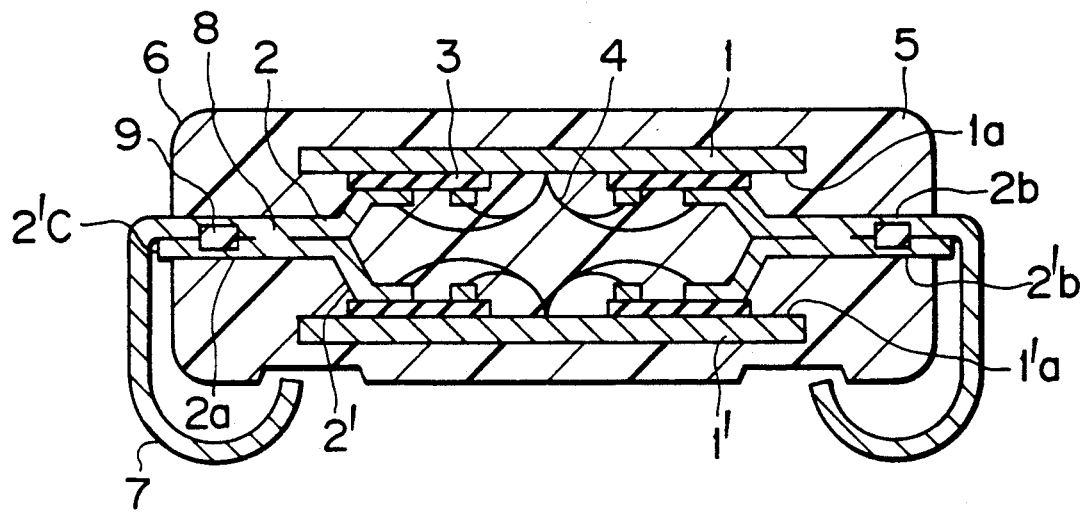
Figure 6:
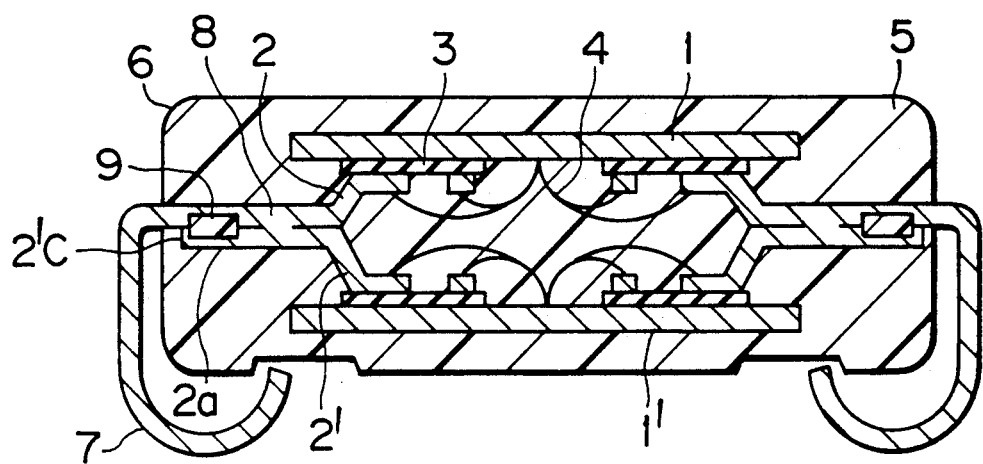

Furthermore, in the embodiment shown in FIG. 1, the electric signal lead 2' is cut at the same level as the side surface of the plastic package 6. However, a cutting portion 2'c of the electric signal lead 2' may be provided on the outer side of the side surface of the plastic package 6, as shown in FIG. 5.

Alternatively, the cutting of the electric signal lead 2' may be effected in the inner side of the side surface of the plastic package 6 and hence provide inside the plastic package 6. In this case, cutting of the electric signal lead 2' is performed prior to molding of the resin 5.

Figure 7:
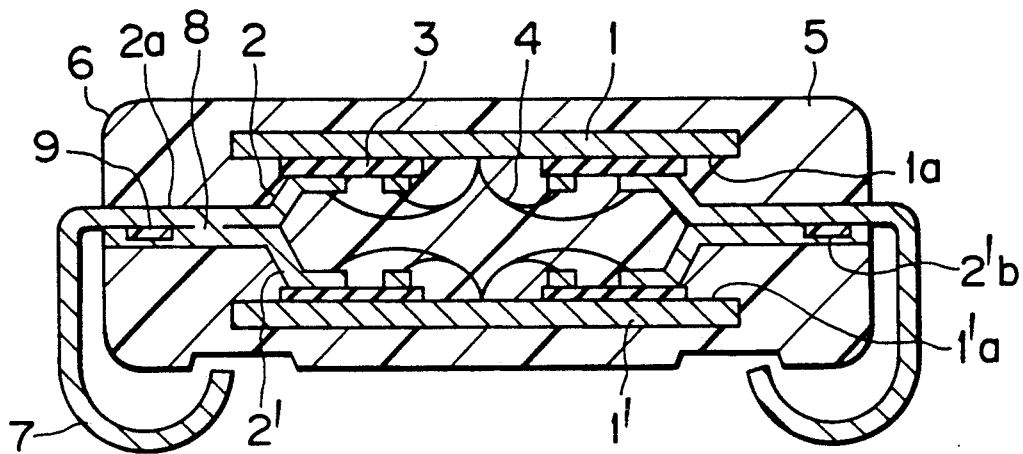

It is not necessary for the thin wall portions 2b and 2'b to be provided in both the electric signal leads 2 and 2' which are overlaid on top of one another. A thin wall portion may be formed in at least one electric signal lead 2, as shown in FIG. 7.

Figure 8:
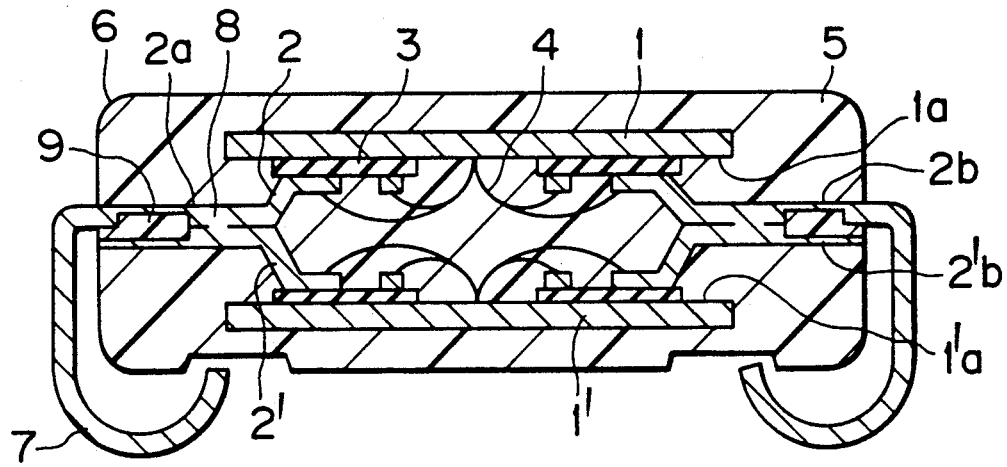

Furthermore, at least one of the thin wall portions 2b and 2'b may be formed such that it reaches the side surface of the plastic package 6, as shown in FIG. 8, so that one end of the resin providing portion 9 may be at the level flush with the side surface of the plastic package 6.

In the embodiment shown in FIG. 1, the resin providing portion 9 is formed within the overlaid portion 2a of the electric signal leads 2 and 2' by providing the thin wall portions. However, it may be formed in any of the following manners.

Figure 9:
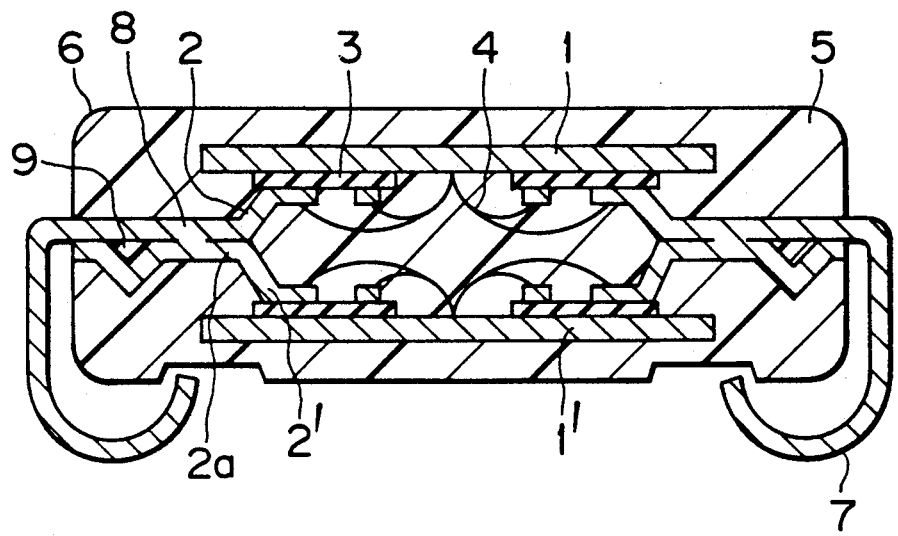
FIG. 9 is a cross-sectional view of the plastic sealed type semiconductor apparatus illustrating one means of forming a resin providing portion.

FIG. 9 illustrates one of such resin providing portion forming means. As shown in FIG. 9, the resin providing portion 9 is formed by bending the electric signal lead 2' in a direction of the thickness thereof. In the example shown in FIG. 9, only one of the electric signal leads is bent to form the resin providing portion. However, both of the electric signal leads may be bent to form the resin providing portion. Also, to facilitate bending of the electric signal lead in a predetermined form, the thickness of the electric signal lead may be partially reduced.

Figure 10:
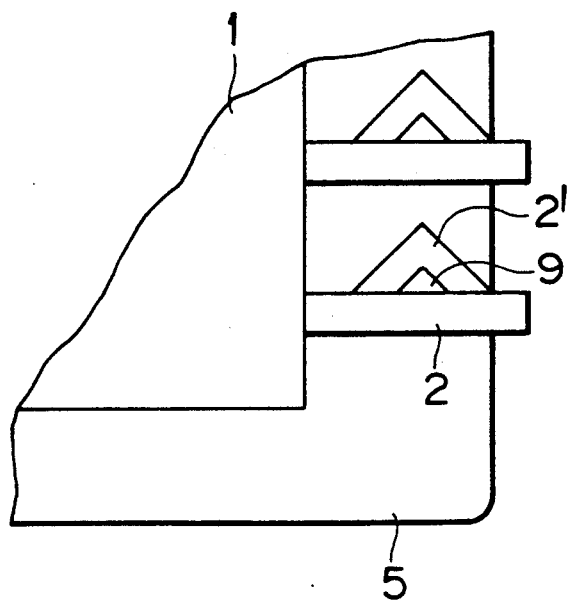
FIG. 10 is a partial plan view of the plastic sealed type semiconductor apparatus illustrating another means of forming the resin providing portion.

FIG. 10 illustrates another example of the resin providing portion forming means. In FIG. 10, the resin providing portion 9 is formed between the electric signal leads 2 and 2' by bending the electric signal lead 2' in a direction of width thereof. The resin providing portion may be formed by bending one of the electric signal leads, as shown in FIG. 10, or both of the electric signal leads.

Figure 11:
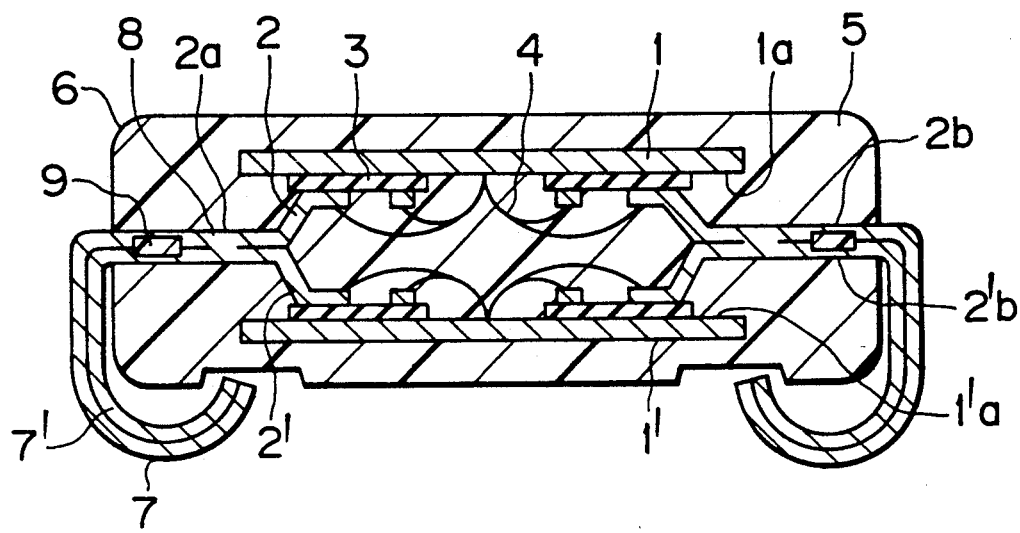
FIG. 11 is a cross-sectional view of the plastic sealed type semiconductor apparatus illustrating another embodiment of the present invention.

FIG. 11 is a cross-sectional view of another embodiment of the plastic sealed type semiconductor apparatus according to the present invention. In the first embodiment shown in FIG. 1, one electric signal lead 2' is cut. However, in this embodiment, the electric signal lead 2' is not cut so that one end thereof may form an outer lead 7' outside the plastic package 6, as shown in FIG. 11.

Figure 12:
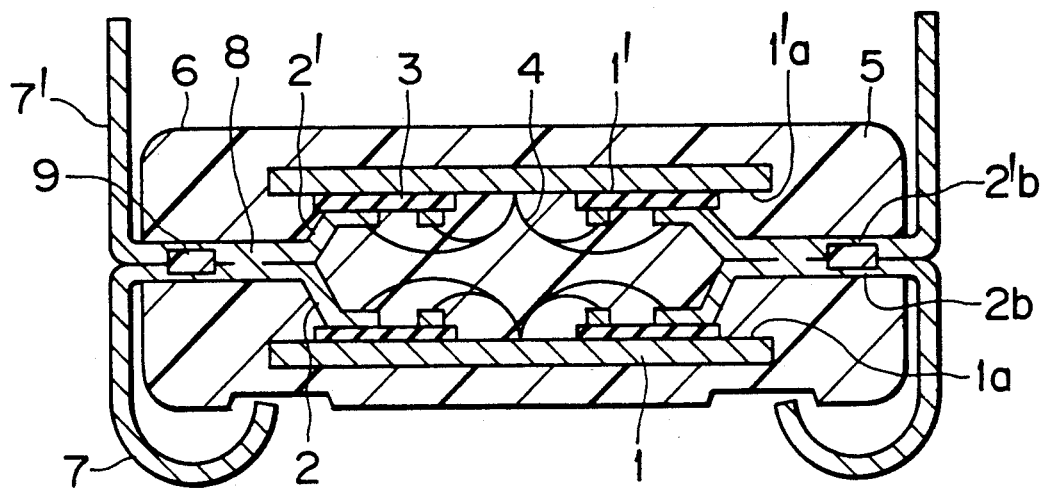
FIG. 12 is a cross-sectional view of the plastic sealed type semiconductor apparatus illustrating still another embodiment of the present invention.

The outer leads 7 and 7' may be bent in the same direction, as shown in FIG. 11, or in the different directions, as shown in FIG. 12. In the structure shown in FIG. 12, one outer lead 7 is bent below the plastic package 6 while the other outer lead 7' is bent above the plastic package 6. In this embodiment, since the outer lead 7' can be used as a heat radiating lead, the heat radiation performance of the plastic sealed type semiconductor apparatus can be improved.

Figure 13:
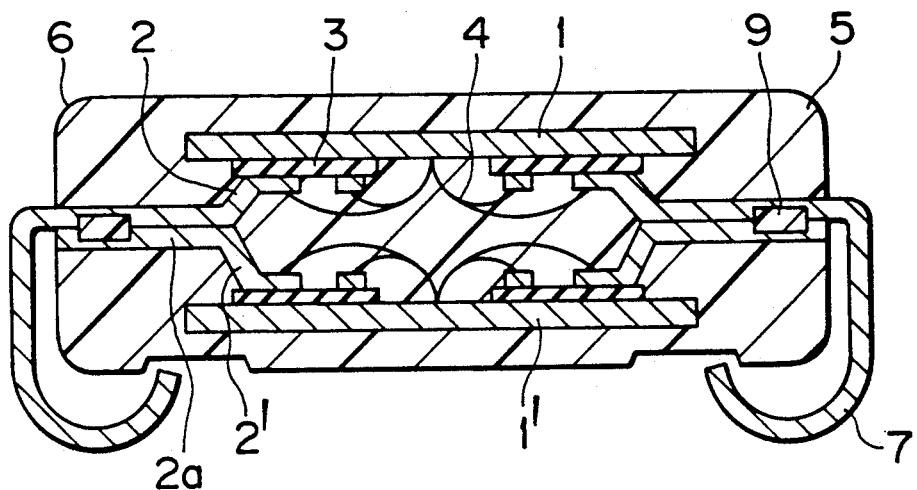
FIG. 13 is a cross-sectional view of the plastic sealed type semiconductor apparatus illustrating still another embodiment of the present invention.

FIG. 13 is a cross-sectional view of a third embodiment of the plastic sealed type semiconductor apparatus according to the present invention. In FIG. 13, the two semiconductor devices 1 and 1' are disposed such that the circuit forming surfaces 1a and 1a oppose each other by overlaying the electric signal leads 2 and 2' on top of one another. The resin providing portion 9 is formed in the overlaid portion 2a of the electric signal leads 2 and 2'.

In this embodiment, a semiconductor apparatus is formed by sealing with the resin 5 the semiconductor devices 1 and 1', the electric signal leads 2 and 2', the insulating members 3 for providing electric insulation between the semiconductor devices and the electric signal leads and the thin metal wires 4 for electrically connecting the semiconductor devices to the electric signal leads. One end of the electric signal lead 2 integrally forms the outer lead 7. The electric signal lead 2' is cut outside the plastic package 6.

In this embodiment, entry of water contents into the interior of the semiconductor apparatus can be prevented by the provision of the resin providing portion 9, and corrosion or breakage of the electric interconnections formed on the circuit forming surfaces 1a and 1'a of the semiconductor devices 1 and 1' or thin metal wires 4 can thus be avoided. It is therefore possible to provide a highly reliable plastic sealed type semiconductor apparatus which is capable of preventing entry of water contents.

A method of manufacturing a plastic sealed type semiconductor apparatus will be described below.

Figure 14:
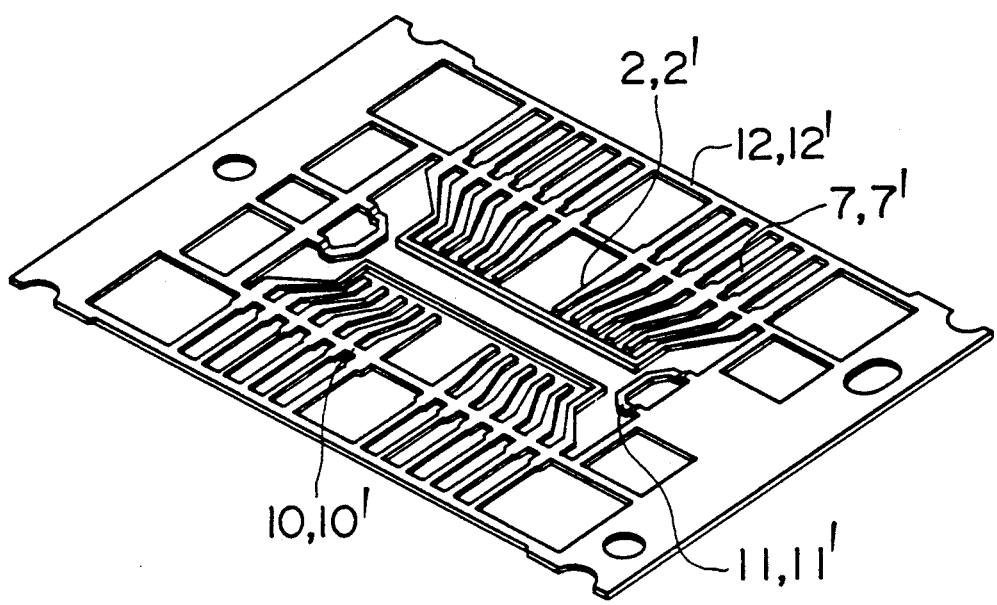
FIG. 14 is a plan view of a lead frame.

The electric signal leads 2 and 2', the outer leads 7 and 7', dam-bar leads 10 and 10', and supporting leads 11 and 11', in combination, form lead frames 12 and 12' as shown in FIG. 14. Two lead frames 12 and 12' are molded and have the same configuration. Therefore, FIG. 14 shows only one lead frame.

The electric signal leads 2 and 2' are adhered by using adhesive to the circuit forming surfaces 1a and 1'a of the semiconductor devices 1 and 1' with an insulating member 3 for providing electric insulation between the semiconductor devices 1 and 1' and the electric signal leads 2 and 2' therebetween, and the semiconductor devices 1 and 1' are electrically connected to the electric signal leads 2 and 2' by the thin metal wires 4.

Next, the lead frames 12 and 12' are overlaid on top of one another such that the circuit forming surfaces 1a and 1'a of the two semiconductor devices 1 and 1' oppose each other, and the dam-bar leads 10 and 10' of the lead frames 12 and 12' are joined to each other by soldering or welding.

Thereafter, the resin 5 is molded around the above-mentioned components. Subsequently, unnecessary portions of the lead frames 12 and 12' (the dam-bar leads 10 and 10' etc.) are cut out, and the outer leads 7 are shaped in a predetermined form to provide a plastic sealed type semiconductor device.

Figure 15:
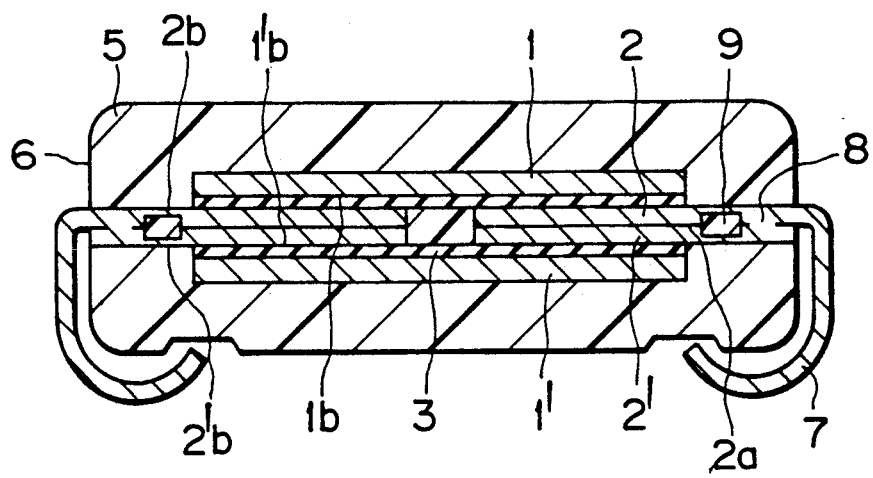
FIG. 15 is a cross-sectional view of the plastic sealed type semiconductor apparatus illustrating still another embodiment of the present invention.

FIG. 15 is a cross-sectional view of a fourth embodiment of the plastic sealed type semiconductor apparatus according to the present invention.

In FIG. 15, one end portion of the electric signal lead 2 forms the outer lead 7, and one end of the electric signal lead 2' is cut at the position flush with the side surface of the plastic package 6.

The electric signal leads 2 and 2' are respectively adhered by using adhesive etc. to the circuit nonforming surfaces 1b and 1b' of the semiconductor devices 1 and 1' with the insulating member 3 therebetween. The semiconductor devices 1 and 1' are electrically connected to the electric signal leads 2 and 2' by the thin metal wires 4 which are not shown. The two semiconductor devices 1 and 1' are disposed such that the circuit nonforming surfaces 1b and 1b, oppose each other. The electric signal leads 2 and 2' are joined to each other at the joined portion 8 in the overlaid portion 2a.

The overlaid portion 2a of the electric signal leads 2 and 2' has the thin wall portions 2b and 2b' to allow a resin 5 to be provided between the electric signal leads 2 and 2'. When the semiconductor device are sealed with the resin 5, a resin providing portion 9 is formed between the thin wall portions 2b and 2'b. In this embodiment, the semiconductor devices 1 and 1', the electric signal leads 2 and 2', the insulating member 3 and the thin metal wires 4 are sealed with the resin 5 to form a semiconductor apparatus.

The plastic-sealed type semiconductor apparatus of this embodiment has the structure in which the two semiconductor devices, each of which has the chip-on-lead structure in which the semiconductor device is mounted on the electric signal lead with the insulating member therebetween, are overlaid on top of one another. In this embodiment, it is possible to provide a highly reliable plastic sealed type semiconductor apparatus which can prevent entry of water contents.

Figure 16:
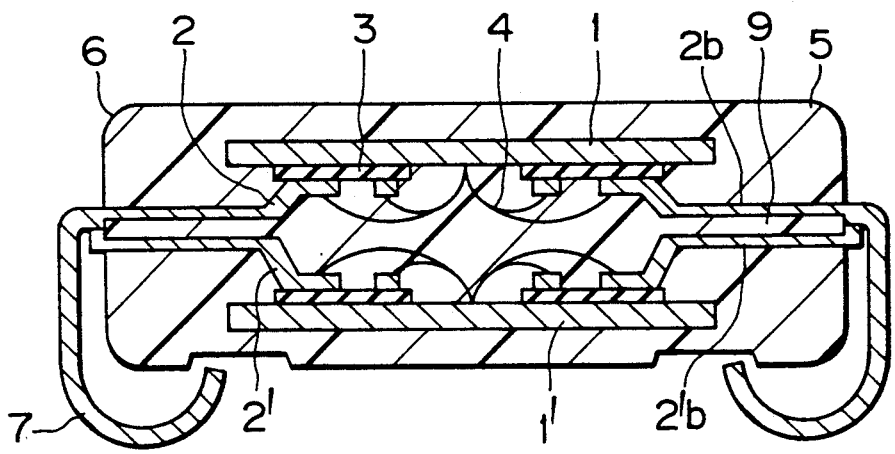
FIG. 16 is a cross-sectional view of the plastic sealed type semiconductor apparatus illustrating still another embodiment of the present invention.
Figure 17:
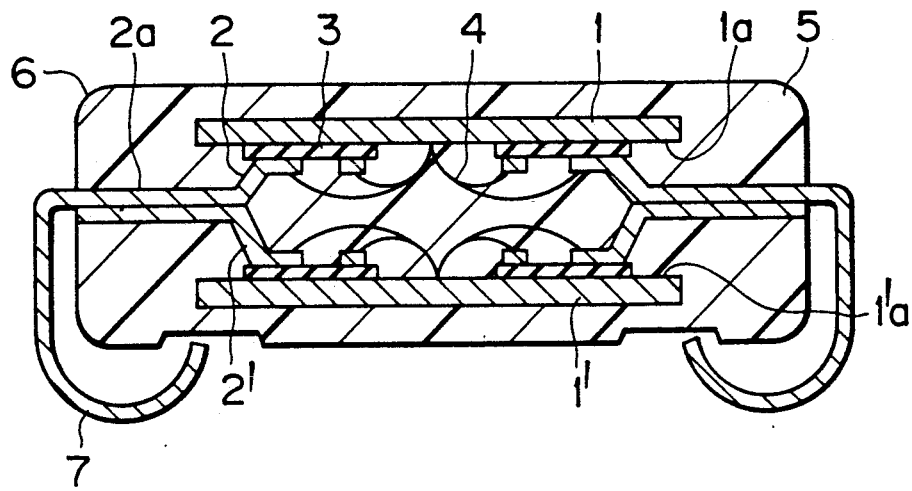
FIG. 17 is a cross-sectional view of a conventional plastic sealed type semiconductor apparatus of the type in which two semiconductor devices having the lead-on-chip structure are mounted.

FIG. 16 shows a fifth embodiment of the present invention. As shown in FIG. 16, the thickness of the portion of the lead joined portion which is located outside the plastic package is made thick, while the thickness of the portion thereof located within the plastic package is made thin, resulting in the formation of a space between the upper and lower leads as the resin providing portion. A sheet, such as an insulating film, may be provided in the space portion between the upper and lower leads. Alternatively, a combination of the sealing resin and the sheet may be provided.

According to the present invention, it is possible to provide a highly reliable plastic sealed semiconductor apparatus which enables the external dimensions thereof not to be increased even when a plurality of semiconductor devices having a high degree of integration are mounted therein, which assures a sufficient lead fixing strength, and which can prevent corrosion or breakage of the electric interconnections formed on the circuit forming surface of the semiconductor device or thin metal wires.

What is claimed is:

1. A plastic sealed type semiconductor apparatus in which at least two semiconductor devices are disposed with a space therebetween such that circuit forming surfaces thereof oppose each other, in which an electric signal lead is electrically connected to each of the circuit forming surfaces, in which the electric signal leads are overlaid on top of one another, and in which a plastic package is formed by sealing with a resin said semiconductor devices and the electric signal leads, wherein an overlaid portion of the electric signal leads has a surface contact portion of the leads and a resin providing portion, and wherein said resin providing portion is a recessed portion formed in such a manner that it passes through the surface contact portion of the leads in the lateral direction thereof.

2. A plastic sealed type semiconductor apparatus according to claim 1, wherein the resin providing portion is formed by forming a notch or a thin wall portion in each of the opposing surfaces of the electric signal leads in such a manner that it passes through the leads in the lateral direction thereof.

3. A plastic sealed type semiconductor apparatus according to claim 1, wherein one of said electric signal leads is cut.

4. A plastic sealed type semiconductor apparatus according to claim 3, wherein one of said electric signal leads is cut at the outside of the plastic package.

5. A plastic sealed type semiconductor apparatus in which at least two semiconductor devices are disposed with a space therebetween such that circuit forming surfaces thereof oppose each other, in which an electric signal lead is electrically connected to each of the circuit forming surfaces, in which the electric signal leads are overlaid on top of one another, and in which a plastic package is formed by sealing with a resin the semiconductor devices and the electric signal leads, wherein the overlaid portion of the electric signal leads has a surface contact portion of the leads and a resin providing portion, the leads are joined to each other at part of the surface contact portion thereof, and said resin providing portion is formed between the joined portion and a lead extending point where the lead is extended to the outside of the plastic package in such a manner that it passes through the leads in the lateral direction thereof.

6. A plastic sealed type semiconductor apparatus according to claim 5, wherein one of said electric signal leads which are joined to each other is cut.

7. A plastic sealed type semiconductor apparatus according to claim 6, wherein one of said electric signal leads which are joined to each other is cut at the outside of the plastic package.

8. A plastic sealed type semiconductor apparatus in which at least two semiconductor devices are disposed with a space therebetween such that the circuit forming surfaces thereof oppose each other, in which an electric signal lead is electrically connected to each of the circuit forming surfaces, in which the electric signal leads are overlaid on top of one another, and in which a plastic package is formed by sealing with a resin the semiconductor devices and the electric signal leads, wherein the overlaid portion of the electric signal leads has a surface contact portion of the leads and a resin providing portion, the leads are joined to each other at part of the surface contact portion thereof, and said resin providing portion is formed between the joined portion and a lead extending portion from which the lead is extended to the outside of the plastic package in such a manner that it passes through the leads in the lateral direction thereof and that it is exposed to the outside of the plastic package.

9. A plastic sealed type semiconductor apparatus according to claim 8, wherein one of said electric signal leads which are joined to each other is cut.

10. A plastic sealed type semiconductor apparatus according to claim 9, wherein one of said electric signal leads which are joined to each other is cut at the outside of the plastic package.

11. A plastic sealed type semiconductor apparatus in which at least two semiconductor devices are disposed with a space therebetween such that the circuit forming surfaces thereof oppose each other, in which an electric signal lead is electrically connected to each of the circuit forming surfaces, in which the electric signal leads are overlaid on top of one another, and in which a plastic package is formed by sealing with a resin the semiconductor devices and the electric signal leads, wherein the overlaid portion of the electric signal leads has a surface contact portion of the leads and a resin providing portion, the leads are joined to each other at part of the surface contact portion thereof, and said resin providing portion is formed on an inner side of the joined portion in such a manner that it passes though the leads in the lateral direction thereof.

12. A plastic sealed type semiconductor apparatus according to claim 11, wherein one of said electric signal leads which are joined to each other is cut.

13. A plastic sealed type semiconductor apparatus according to claim 12, wherein one of said electric signal leads which are joined to each other is cut at the outside of the plastic package.

14. A plastic sealed type semiconductor apparatus in which at least two semiconductor devices are disposed with a space therebetween such that the circuit forming surfaces thereof oppose each other, in which an electric signal lead is electrically connected to each of the circuit forming surfaces, in which the electric signal leads are overlaid on top of one another, and in which a plastic package is formed by sealing with a resin the semiconductor devices and the electric signal leads, wherein the overlaid portion of the electric signal leads has a surface contact portion of the leads and a resin providing portion, the leads are joined to each other at part of the surface contact portion thereof outside of the plastic package, and said resin providing portion is formed on an inner side of the joined portion in such a manner that it passes through the leads in the lateral direction thereof.

15. A plastic sealed type semiconductor apparatus according to claim 14, wherein one of said electric signal leads which are joined to each other is cut at the outside of the plastic package.

* * * * *